(12) United States Patent
Ali

(10) Patent No.: US 8,440,574 B2
(45) Date of Patent: *May 14, 2013

(54) POST CHROMIUM ALLOY PLASMA ETCH ASHING PROCESS

(75) Inventor: Abbas Ali, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 132 days.

This patent is subject to a terminal disclaimer.

(21) Appl. No.: 12/577,309

(22) Filed: Oct. 12, 2009

(65) Prior Publication Data

US 2011/0086518 A1 Apr. 14, 2011

(51) Int. Cl.
*H01L 21/28* (2006.01)

(52) U.S. Cl.
USPC .......................................... 438/720; 216/79

(58) Field of Classification Search .................. None
See application file for complete search history.

(56) References Cited

U.S. PATENT DOCUMENTS

| 6,081,014 | A  | * | 6/2000  | Redford et al. ............... 257/359 |
| 2004/0262264 | A1 | * | 12/2004 | Crawford et al. ............... 216/79 |
| 2006/0141799 | A1 | * | 6/2006  | Jo ................................. 438/734 |
| 2007/0207275 | A1 | * | 9/2007  | Nowak et al. ................. 427/569 |

OTHER PUBLICATIONS

Sierra, Economical Mass Flow Meters & Controllers, Smart-Trak 50 series, Date N/A, Sierra.*
Spilzlsperger, High Temperature Oxygen Process, Spitzlsperger, 2007, p. 1.*
Chen et al, High-Throughput Photoresist Strip Using a Toroidal RF Plasma Source in Ashers, Nov. 2005, Semiconductor Manufacturing Magazine.*
Wolf et al, Silicon Processing for th VLSI Era vol. 1—Process Technology, 1986, Lattice Press, p. 546-547, 618-619.*
Ruhl et al, An optimized process for: dry stripping photomasks., May 2003, Solid State Technology.*
Wolf et al, Silicon processing for the VLSI Era vol. 1—Process Technology, 1986, Lattice Press, p. 539.*

* cited by examiner

*Primary Examiner* — Binh X Tran
*Assistant Examiner* — David Cathey, Jr.
(74) *Attorney, Agent, or Firm* — Jacqueline J. Garner; Wade J. Brady, III; Frederick J. Telecky, Jr.

(57) ABSTRACT

A method for ashing hardened resist from a photoresist patterned chromium alloy post etch using a plasma ashing chemistry which contains no gaseous source of hydrogen and contains a gaseous source of oxygen and a gaseous source of nitrogen with an oxygen to nitrogen atomic ratio of at least 5.

20 Claims, 1 Drawing Sheet

POST CHROMIUM ALLOY PLASMA ETCH ASHING PROCESS

FIELD OF THE INVENTION

This invention relates to the field of plasma etching. More particularly, this invention relates to resist removal from chromium alloys post etch using an ashing process.

BACKGROUND OF THE INVENTION

Thin chromium alloy films that are patterned with photoresist and etched using reactive ion etching (RIE) are well known in semiconductor processing. For example, chromium alloy thin film resistors are used in integrated circuits and chromium alloy thin films are used to form the light blocking patterns on photo masks.

During the reactive ion etching (RIE) of chromium alloys the resist may be partially etch away. Also chromium alloy etching products may react with the sidewalls of the resist forming hardened sidewalls that form a fence around the chromium alloy device structure. This fence material is resistant to conventional resist ashing processes and may leave residue and particles on the wafer which may negatively impact yield of the integrated circuit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A hydrogen free resist ashing process with an atomic ratio of oxygen to nitrogen of at least 5 is used to remove resist that has been hardened during the plasma etching of chromium alloys.

DETAILED DESCRIPTION

Figure 1A:
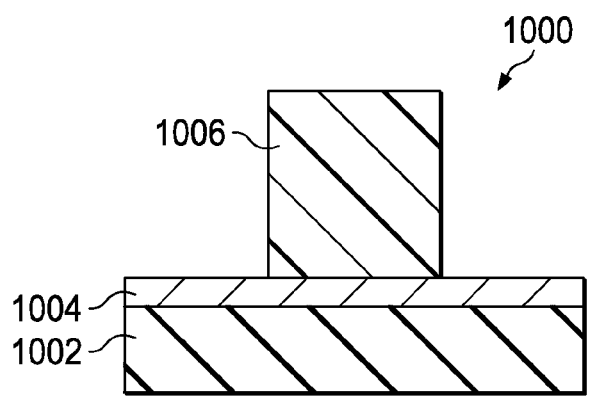
FIG. 1A through 1C are crossections of process steps describing the formation of a chromium alloy device according to the invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

During the plasma etching of a chromium alloy thin film that has been patterned with photoresist, the sidewalls of the resist may react with etch products from the chromium film and become hardened and cause fences to form at the sides of the chromium alloy device. Post chromium alloy etch, the remaining resist is typically removed using an oxygen containing plasma. Conventional resist removing plasma processes, also called ashing, have difficulty removing the hardened photoresist fences. This may cause residues and particles to remain on the wafer post ashing that may result in reduced integrated circuit yield.

Figure 1B:
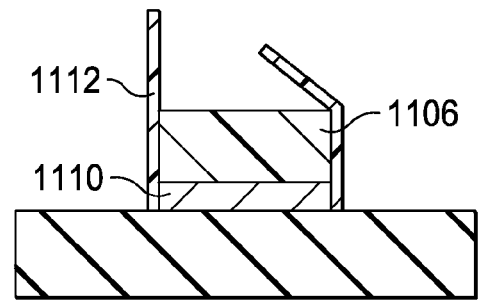
Figure 1C:
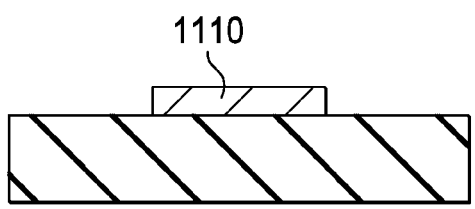

FIGS. 1A through 1C show crossectional views of process steps in the formation of a chromium alloy device according to an embodiment. For purposes of illustration, a chromium alloy resistor is used, but other devices such as chromium alloy local interconnect or a chromium alloy fuse may also be used. Chromium alloys may include Cr, CrO, CrN, CrON, NiCr, NiCrC, SiCr, SiCrC, SiCrO, SiCrCO, SiCrN, SiCrCN, SiCrCON, and SiCrON. Additionally the chromium alloy device may be a light blocking structure composed of a material such as Cr and CrN and formed on a photomask.

In FIG. 1A, a chromium alloy film (1004) is deposited upon a dielectric film (1002). The dielectric film may be deposited over a silicon wafer for example upon which transistors for an integrated circuit have been formed. Typically when forming a chromium alloy resistor, transistors are formed on a semiconductor substrate and then covered with a dielectric. The chromium alloy resistor may be formed before the first interconnect or may be formed after one or more of the interconnects. A typical chromium alloy resistor may be composed of SiCrC.

Still referring to FIG. 1A, a photoresist pattern (1006) is formed on the chromium alloy film (1006) to form a chromium alloy resistor.

FIG. 1B is an illustration of the chromium alloy resistor (1100) post etch. A portion of the photoresist (1106) is etched away and fences (1112) of a resist hardened material are formed by the reaction of the resist (1106) sidewalls with chromium alloy etch products. These fences (1112) may remain vertical and attached to the edges of the chromium alloy resistor (1110), but the fences may also fall over onto or away from the resistor post etch.

Figure 2:
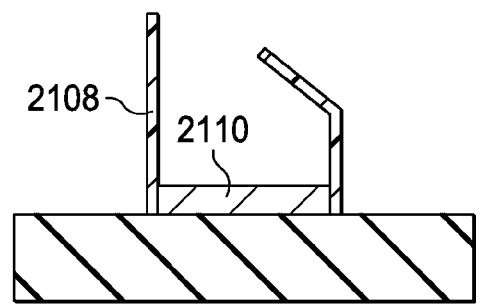
FIG. 2 (prior art) is a crossection of a chromium alloy device post ash according to a prior art ashing process.

FIG. 2 shows the chromium alloy resistor (2110) after a conventional ashing process containing a hydrogen source has been performed to remove the remaining photoresist (1106). Conventional ashing processes contain oxygen in the plasma and may also contain nitrogen in the plasma but with a oxygen to nitrogen atomic ratio of less than 5. Conventional ashing processes typically also contain gases that are sources of hydrogen which exacerbate the hardening of the fence material by facilitating crosslinking of the photoresist polymer. Because of the difficulty in ashing the hardened fence material, fence material may remain after conventional ashing. Conventional post ashing cleanup processes may use a physical scrubbing to attempt to remove the remaining fence material.

Instead of the conventional ash, a novel ash according to an embodiment of the invention is performed. FIG. 1C is a crossectional view of the chromium alloy resistor (1110) post ash according to an embodiment of the instant invention. As is evident in FIG. 1C, the remaining resist (1106) is removed and also the resist hardened fences (1112) seen in FIG. 1B are removed. The chromium alloy resistor (1110) is free of residue.

The plasma ashing conditions of the present embodiment are described in the Table 1. The embodiment process has no gaseous source of hydrogen and also includes an oxygen to nitrogen atomic ratio of at least 5. Process conditions include a source power in the range of 500 to 2000 watts, pressure in the range of 1 to 10 torr, temperature in the range of 150 to 400 degrees Celsius, an oxygen flow rate of 1000 to 5000 sccm, and a nitrogen flow rate of 100 to 600 sccm. The preferred embodiment for ashing resist after a chromium alloy etch is a source power of 1400 watts, a pressure of 2 Torr, a temperature of 300 C, an oxygen flow of 3500 sccm, a nitrogen flow of 290 sccm, and an oxygen to nitrogen atomic ratio of about 12. Unlike prior art metal and chromium alloy ashes, this ash does not contain hydrogen. Hydrogen increases the crosslinking of polymers in the fences making ashing more difficult. Removing hydrogen from the plasma enables the hardened resist fences to be removed with little to no residue remaining Nitrogen in the plasma enhances the formation of free oxygen radicals which improves ashing capability.

TABLE 1

| ITEM | RANGE | PREFERRED EMBODIMENT | UNITS |
| --- | --- | --- | --- |
| Source Power | 500-2000 | 1400 | watts |
| Pressure | 1-10 | 2 | Torr |
| Temperature | 150-400 | 300 | C. |
| O2 | 1000-5000 | 3500 | sccm |
| N2 | 100-600 | 290 | sccm |

The ashing of resist post SiCrC etch has been described to illustrate the embodiment but the ashing of resist post etching of other chromium alloys such as SiCr, SiOCr, SiNCr, NiCr, and NiCCr for example may also be used. While the preferred embodiment is oxygen and nitrogen plasma gases, other gaseous sources of nitrogen and oxygen such as $N_xO_y$ may be used and other gases such as He or Ar may be added to the plasma and remain within the scope of the embodiment.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for plasma ashing photoresist, comprising:
providing a silicon-chromium alloy thin film that has been patterned with a photoresist pattern and etched with a plasma etch such that chromium alloy etch product reacts with the photoresist pattern to form a resist hardened silicon-chromium etch product fence material; and
exposing said photoresist pattern including said resist hardened silicon-chromium etch product fence material to a plasma ashing chemistry containing no gaseous source of hydrogen, containing a gaseous source of oxygen and containing a gaseous source of nitrogen with an oxygen to nitrogen atomic ratio of at least 5 to remove said fence material.

2. The method of claim 1 where said gaseous source of oxygen is $O_2$ and said gaseous source of nitrogen is $N_2$.

3. The method of claim 1 where said oxygen to nitrogen atomic ratio is about 12.

4. The method of claim 1 where $N_xO_y$ is at least one of said gaseous source of oxygen and said gaseous source of nitrogen.

5. The method of claim 1 wherein said silicon-chromium alloy thin film is selected from the group consisting of:
SiCr,
SiCrC,
SiCrO,
SiCrCO,
SiCrN,
SiCrCN,
SiCrON, and
SiCrCON.

6. The method of claim 1 wherein said thin film is SiCrC.

7. The method of claim 1 where a source power is in a range of 500 to 2000 watts, a pressure is in a range of 1 to 10 torr, a temperature is in a range of 150 to 400 degrees Celsius, said oxygen source is oxygen gas with a flow in a range of 1000 to 5000 sccm, and said nitrogen source is nitrogen gas with a flow in a range of 100 to 600 sccm.

8. The method of claim 7 where said source power is about 1400 watts, said pressure is about 2 torr, said temperature is about 300 degrees Celsius, said oxygen flow is about 3500 sccm and said nitrogen flow is about 290 sccm, and said oxygen to nitrogen atomic ratio is about 12.

9. The method of claim 1 where said plasma ashing chemistry further includes at least one of He and Ar.

10. A method of fabricating an integrated circuit, comprising the steps of:
forming a SiCrC layer over a semiconductor substrate;
forming a photoresist pattern over the SiCrC layer;
plasma etching the SiCrC layer such that SiCrC etch products react with the photoresist pattern to form a resist hardened SiCrC etch product fence material;
exposing said photoresist pattern including said fence material to a plasma ashing chemistry containing no gaseous sources hydrogen and containing a gaseous source of oxygen and a gaseous source of nitrogen to remove said photoresist pattern including said fence material.

11. The method of claim 10 where said gaseous source of oxygen is $O_2$ and said gaseous source of nitrogen is $N_2$.

12. The method of claim 10 where said oxygen to nitrogen atomic ratio is about 12.

13. The method of claim 10 where $N_xO_y$ is at least one of said gaseous source of oxygen and said gaseous source of nitrogen.

14. The method of claim 10 where a source power is in a range of 500 to 2000 watts, a pressure is in a range of 1 to 10 torr, a temperature is in a range of 150 to 400 degrees Celsius, said oxygen source is oxygen gas with a flow in a range of 1000 to 5000 sccm, and said nitrogen source is nitrogen gas with a flow in a range of 100 to 600 sccm.

15. The method of claim 14 where said source power is about 1400 watts, said pressure is about 2 torr, said temperature is about 300 degrees Celsius, said oxygen flow is about 3500 sccm and said nitrogen flow is about 290 sccm, and said oxygen to nitrogen atomic ratio is about 12.

16. A method for plasma ashing photoresist, comprising:
providing a nickel-chromium alloy thin film that has been patterned with a photoresist pattern and etched with a plasma etch such that chromium alloy etch product reacts with the photoresist pattern to form a resist hardened nickel-chromium etch product fence material; and exposing said photoresist pattern including said resist hardened nickel-chromium etch product fence material to a plasma ashing chemistry containing no gaseous source of hydrogen, containing a gaseous source of oxygen and containing a gaseous source of nitrogen with an oxygen to nitrogen atomic ratio of at least 5 to remove said fence material.

17. The method of claim 16 where said gaseous source of oxygen is $O_2$ and said gaseous source of nitrogen is $N_2$.

18. The method of claim 16 where said oxygen to nitrogen atomic ratio is about 12.

19. The method of claim 16 where $N_xO_y$ is at least one of said gaseous source of oxygen and said gaseous source of nitrogen.

20. The method of claim 16 wherein said nickel chromium alloy thin film is selected from the group consisting of: NiCr and NiCrC.

\* \* \* \* \*